United States Patent
Macionczyk (10) Patent No.: US 8,356,808 B2
(45) Date of Patent: Jan. 22, 2013

(54) APPARATUS FOR TURNING OVER AN ARTICLE IN A VACUUM COATING SYSTEM AND METHOD FOR TURNING OVER SAID ARTICLE IN A VACUUM COATING SYSTEM

(75) Inventor: Frank Macionczyk, Oberkochen (DE)

(73) Assignee: Carl Zeiss Vision GmbH, Aalen (DE)

( * ) Notice: Subject to any disclaimer, the term of this patent is extended or adjusted under 35 U.S.C. 154(b) by 623 days.

(21) Appl. No.: 12/379,809

(22) Filed: Mar. 2, 2009

(65) Prior Publication Data

US 2009/0206535 A1 Aug. 20, 2009

Related U.S. Application Data

(63) Continuation-in-part of application No. PCT/EP2007/007522, filed on Aug. 29, 2007.

(51) Int. Cl.
*B23Q 3/18* (2006.01)

(52) U.S. Cl. .............................. 269/58; 269/55

(58) Field of Classification Search ..................... 269/55, 269/58

See application file for complete search history.

(56) References Cited

U.S. PATENT DOCUMENTS

| | | |
|---|---|---|
| 3,396,696 A | 8/1968 | Becker |
| 3,859,956 A | 1/1975 | Paola |
| 4,817,559 A * | 4/1989 | Ciparisso ..................... 118/731 |
| 5,026,469 A * | 6/1991 | Kunkel et al. ............ 204/298.15 |

FOREIGN PATENT DOCUMENTS

| | | |
|---|---|---|
| EP | 0 806 493 A2 | 11/1997 |
| JP | 2003-313653 | 11/2003 |

OTHER PUBLICATIONS

English translation of the Office action of the Chinese Patent Office dated May 13, 2010 in the parallel Chinese application.
English translation of the first examination report of the German Patent and Trademark Office dated Jul. 26, 2007 in the parallel German application.
English translation of the second examination report of the German Patent and Trademark Office dated Sep. 1, 2011 in the parallel German application.

* cited by examiner

*Primary Examiner* — Lee D Wilson
*Assistant Examiner* — Shantese McDonald
(74) *Attorney, Agent, or Firm* — Walter Ottesen

(57) ABSTRACT

An apparatus for turning over an article (12) in a vacuum coating system includes a holder (10) for the article (12), which is mounted rotatably about an axis of rotation (23) on a carrier. The apparatus further includes a turnover device (2, 4, 28) turning over the holder (10) by rotation about the axis of rotation (23) by utilizing a force generator. The turnover device (2, 4, 28) generates a force which turns over the holder (10) without mechanical coupling and without movable mechanical components between the turnover device (2, 4, 28) and the holder (10). A method of turning over an article (12) and for using the device or the method for turning over, in particular a plastic ophthalmic lens (12), is also disclosed.

28 Claims, 3 Drawing Sheets

FIG. 3

APPARATUS FOR TURNING OVER AN ARTICLE IN A VACUUM COATING SYSTEM AND METHOD FOR TURNING OVER SAID ARTICLE IN A VACUUM COATING SYSTEM

CROSS REFERENCE TO RELATED APPLICATIONS

This application is a continuation-in-part application of international patent application PCT/EP 2007/007522, filed Aug. 29, 2007, designating the United States and claiming priority from German application 10 2006 041 137.4, filed Sep. 1, 2006, and the entire content of both applications is incorporated herein by reference.

FIELD OF THE INVENTION

The invention relates to an apparatus for turning over an article such as an optical element (for example, a lens) or a non-optical element (for example, a drill bit) before or during or after coating in a vacuum coating system. The invention also relates to a method for turning over an article in the vacuum coating system.

BACKGROUND OF THE INVENTION

A vacuum coating system is here a system with which articles can be coated under vacuum conditions and especially under high vacuum conditions. These systems include, for example, cathode atomizing systems (sputter systems), vaporization systems or chemical gas phase deposition systems.

An optical element is in the following an object or article which has the function of absorbing, transmitting, reflecting, refracting or scattering an electromagnetic radiation such as visible light, UV-radiation or IR-radiation. These articles include especially: lenses, for example, spectacle lenses or contact lenses. Also included are: planar optics and rounded optics, prisms, spherical or aspherical lenses, peripherally-shaped spectacle lenses, elliptical lenses, et cetera. In the following, a non-optical element is here an article of daily use, for example, a work tool or a part thereof such as drill bits or equipment parts.

The phrase "turning over an article" is in the following an operation wherein the surface of the article, which faces toward the coating source, changes in contrast to a pure rotating operation wherein the surface changes with respect to its position to the coating source, however, the surface remains facing toward the coating source. After a turnover of 180°, the back side of the optical element faces toward the coating source.

In the following, the invention is described with respect to an example of an apparatus and a method for turning over ophthalmic plastic lenses. In lieu of ophthalmic plastic lenses, other articles can, however, be turned over with the aid of the apparatus of the invention or with the aid of the method of the invention.

Thin optical layers are applied to the lens surfaces for the anti-reflection coating thereof. The anti-reflection coatings are produced in a high vacuum system. For this purpose, conventional optically effective materials are vaporized in high vacuum from a vapor source or are sputtered from a sputter source and deposited on the lenses. The lenses lie in holding rings or are clamped in clamping rings with one side of the lens facing toward the vaporization source or sputter source. The rings (lens holders) are usually placed in the cutouts of the sheet metal carriers which are mounted above the vaporization source so as to assume the form of a spherical cap and are rotated about the axis of symmetry of the spherical cap by means of a rotation device. The sheet metal carriers form segments of the spherical cap or, in the case of only one sheet metal piece, this piece forms the spherical cap itself. With the use of clamp rings, the lens holders lie with the clamped-in lenses statically in the sheet metal carrier and, after coating of the first lens side, are manually turned over together with the lenses to coat the second lens side. This method is characterized by obtaining, in general, a high yield. Contributing to this fact is that the lenses, in general, run through the vacuum process without being subjected to contamination because of abraded particles from mechanically moving components in the vacuum chamber.

Automatic turnover apparatus for lens holders permit a turning over of the lenses without the vacuum chamber having to be ventilated for manually turning over the lenses after the coating of the first lens side and thereafter be again evacuated. In this way, depending upon the process and system type, the total process time for coating both lens sides is significantly shortened. The conventional turnover apparatus are, however, subjected to several disadvantages for coating processes in the vacuum such as additional surfaces within the vacuum, additional friction surfaces, additional space requirement in the vacuum chamber, additional cleaning efforts and additional system complexities.

Numerous mechanically operating turnover devices have been suggested for automatically turning over the lenses. For example, U.S. Pat. No. 5,026,469 discloses an apparatus for holding and turning over lenses, especially, spectacle lenses in a high vacuum vaporization system having a spring biased ring pair as a lens holder. The lens holder is supported in a spherical cap-shaped sheet metal carrier about a rotational axis to which a toothed wheel is fixedly connected and which terminates in a right-angled bent finger. The finger comes into contact on the sheet metal carrier and limits thereby the rotation possibility of the axis to approximately 180°. The rotational axis can be rotated via the mechanical action of a rake on the toothed wheel which rake is disposed above the sheet metal carrier. The lens holder including the lens is turned over. In order to avoid a repeated mechanical contact with each rotation of the spherical cap, the rake is mechanically moved for the turnover operation in addition to the individual lens holders.

A vacuum coating system is disclosed in U.S. Pat. No. 4,817,559 wherein the segments of the spherical cap are turned over. The lens holders attached therein tilt only slightly about their own rotational axis in order to obtain the best possible orientation of the particular lens side with reference to the vaporization source before and after turning over.

U.S. Pat. No. 3,396,696 discloses a turning over of a plurality of lens holders with the aid of a magnet. The lens holders are mounted on a rotatable carrier. When the carrier is at standstill, a shaft can be moved with the aid of the magnet which turns over the lens holder via correspondingly assigned gears.

In addition, many mechanical turnover devices are known which take up a large portion of the surface available for the vaporization in the vaporization system. The capacity reduction associated therewith stands in contrast to the advantage of the shortening of the total operation of the coating of both lens sides.

SUMMARY OF THE INVENTION

It is an object of the invention to provide an apparatus as well as a method wherein the method advantages of sheet metal carriers without a turnover device are realized and the method advantage of the throughput increase by means of the turnover apparatus is realized. Furthermore, an especially suitable use of the apparatus and of the method are disclosed.

The invention provides for an apparatus for turning over an article, especially an ophthalmic plastic lens in a vacuum coating system with a holder for the article and with a turnover device for turning over the holder via a rotation about the rotational axis. The turnover device includes a force generator required for the rotation of the holder about the rotational axis. The holder is supported so as to be rotatable about a rotational axis. The turnover device, that is the force generator, generates a force which turns over the holder without a mechanical coupling between the turnover device and the holder which is in contrast to the above-described state of the art. In the case of a turnover device for an ophthalmic plastic lens, there is neither a mechanical connection between the force generator and the lens holder or between the force generator and the lens nor are there mechanically movable components or components for transmitting the force between the force generator and the lens holder or lens. The carrier is movable for turning over the holder without the carrier itself being turned over. Alternatively, or in addition, the force generator for turning over the holder is movable relative to the rotational axis of the holder, for example, also without the carrier itself being turned over.

If one proceeds, for example, specifically from a device for holding and turning over lenses (especially for spectacle lenses to be coated in a high vacuum vaporization system or high vacuum sputtering system) with a lens holder supported on a rotatable carrier arranged in the process chamber of the high vacuum system and turnable about a rotational axis, then it is provided, according to the invention, that the force, which is required for turning over the lens holder with the clamped-in lens about its own rotational axis, is transmitted without mechanical connection between the force generator and the lens holder or between the force generator and the lens. This force is in addition to the force for driving the rotatable carrier. Sheet metal carriers can, firstly, be modified with comparatively small, simple, non-movable structures which do not or only slightly reduce the capacity relative to a comparable spherical cap without a turnover apparatus. The force for the turnover movement on the lens holder can, secondly, be transmitted without additional mechanically movable parts and the friction forces during rotation of the lens holder can, thirdly, be held so small that contamination of the lenses because of abraded particles is negligible. To completely turn over the holder, the rotational movement of the rotatable carrier is additionally used or a relative movement of the force generator with reference to the rotational axis of the holder is used without the carrier itself being turned over.

Correspondingly, the turning over of an article, especially an ophthalmic plastic lens, takes place in a vacuum coating system with the following method steps according to the invention:

a) placing the article with a holder, for example, a rotatably supported holder, on a carrier about a rotational axis;

b) turning over the holder holding the article by rotating about the rotational axis.

The turning over of the holder holding the article is carried out with a force without mechanical coupling to the holder. The rotation of the holder about the rotational axis takes place with a force which is generated by a force generator and which is transmitted to the holder without mechanically movable components. Here, the carrier can be moved for turning over the holder (for example, linear or rotating) without the carrier itself being turned over. Alternatively, or in addition, the force generator for turning over the holder is moved relative to the rotational axis of the holder (for example, linearly or rotatingly).

The force, which turns over the holder without mechanical coupling between turnover apparatus and holder, can especially include the inertial force. Alternatively, or additionally, this force can also include the magnetic force of a permanent magnet or of a magnet coil excited with the aid of an electric current. In the first case, the holder is so accelerated or decelerated that the holder turns over as a consequence of its inertia. In the second case, the holder is turned over by magnetic interaction. Both variations are characterized by a contactless force transfer for the turnover operation. The loading of the vacuum coating system with articles, which are to be coated, is greatly simplified in this way because no mechanical connection needs to be established. The establishment of a mechanical connection can usually only take place manually and is therefore time intensive and subject to error.

In an especially advantageous embodiment, a rotatable carrier, especially a spherical cap, can be provided on which the holder is rotatably supported about the rotational axis. The rotational movement of the carrier can be used to turn over the holder holding the article. The carrier can also be configured to be linearly movable, namely, for example, when the carrier is part of a through-run coating system.

In a first variation, the force, which is needed for turning over the holder with the clamped article about its own rotational axis, can be caused by a negative or positive acceleration of the movement of the carrier (for example, the rotational movement when the carrier is rotatable or the linear movement when the carrier is linearly movable). Stated otherwise, the carrier can, for example, be rotatably or linearly accelerated or decelerated so that the holder rotates about its own rotational axis as a consequence of its mass moment of inertia and the held article is thereby turned over. This variation is characterized in that it can be easily implemented in conventional arrangements of the kind described above. For this purpose, a suitable driving of the rotatable carrier is as a rule sufficient.

An especially advantageous embodiment of this variation comprises ensuring that the center of gravity of the article-holding holder lies higher than the center point of the rotational axis of the holder. During acceleration or deceleration of the movable carrier, the holder then rotates inexorably without further external forces about its axis in the predetermined direction. The movable carrier here can, for example, be rotatably movable or linearly movable.

In a second variation, the force, which is required to rotate the holder with the clamped article about its own rotational axis, is caused by magnetic interaction. Stated otherwise, the carrier can be guided through a magnetic force field. Here too, the carrier movement can, for example, be rotational or linear. With the movement of the carrier (for example, rotational movement or linear movement), the holder interacts in such a manner with the magnetic field that the holder turns over. Alternatively, the magnetic force generator can be moved, for example, rotatably or linearly. What is decisive here is a relative movement between force generator and the rotational axis of the holder. This variation is also characterized by a conventional system of the kind described above which can be retrofitted with a simple modification.

A magnetic coil and/or a permanent magnet is provided for generating the magnetic force as already indicated above. A permanent magnet can be mounted on the holder (or on the article to be held) as well as at a distance to the holder whereas a magnetic coil is preferably spaced relative to the holder because of the current supplied thereto although the arrangement thereof on the holder would afford advantages for certain applications. The interaction of the magnetic coil and/or the permanent magnet and/or a magnetizable part on the holder with a magnetic coil and/or permanent magnet and/or a magnetizable part at a distance to the holder is utilized for turning over the holder.

Preferably, the magnetic coil and/or the permanent magnet (especially when coating takes place from below upwardly) is mounted above the carrier which can be rotatable for example. On the one hand, a coating of the magnetic coil and/or permanent magnet is prevented in this way or at least reduced and, on the other hand, there is usually sufficient space to mount a magnetic coil and/or permanent magnet. For the rare case that coating is from above downwardly, the magnetic coil and/or the permanent magnet are preferably disposed beneath the carrier.

As is usual in conventional systems, the holder can have a holding ring which holds the article tight in ring-shaped fashion. The area, which is enclosed by the magnetic coil and/or by the permanent magnet at the lower exit end of the magnetic field lines, then amounts to preferably at least 0.2 times the area enclosed by the holding ring. This measure defines an adequate condition for an as small as possible distance dependent reduction of the magnetic field intensity acting on the holder which, in turn, favors the design of the magnetic field generator with reference to obtaining the magnetic field strength necessary for the turnover operation.

In an especially advantageous variation of a turnover device, which is based on a magnetic interaction, the holder has a magnetizable component which is especially a ferromagnetic component. The magnetizable and especially ferromagnetic part of the holder can either be a fixed part of the holder or be applied as an individual part on the holder.

It has been shown to be advantageous when the magnetizable, especially ferromagnetic part of the holder, is positioned only on one side of the holder subdivided by the rotational axis of the holder so that the magnetic field, which is provided for turning over, can effectively act only on this side of the holder and therefore no counteracting forces occur which are caused by the magnetic field.

In cases where no magnetic, especially ferromagnetic part can be applied to the holder itself, a magnetizable, especially ferromagnetic part, can also be applied to the article, especially to the ophthalmic plastic lens. It is also possible to utilize possibly existing magnetizable or ferromagnetic characteristics of the article itself for the above-described purpose of turning over.

While utilizing the rotation of the spherical cap carrier, the force needed for turning over the holder is the lowest when the rotational axis of the holder is oriented perpendicularly, that is, at an angle of 90° with reference to the tangent of a rotational line of the carrier (for example, a spherical cap). The rotational line is an imaginary line which arises because of the movement of the center point of the rotational axis of a holder, which is placed in the carrier, during the rotation of the carrier. Here, the carrier can, for example, be a spherical cap. For the support of the holder on the carrier (for example, the spherical cap), a place on the carrier (for example, the spherical cap) is needed at one or both ends of the rotational axis. In order to accommodate as many holders as possible on the carrier (for example, the spherical cap), a deviating orientation of the rotational axis of the holder with reference to the tangent of the rotation line can be advantageous for reasons of space, more specifically, in an angular region of 0° to 90° where 0° corresponds to an orientation of the rotational axis of the holder parallel to the tangent of the above-mentioned rotation line.

Two opposite-lying hubs can be mounted on the outer side of the holder and these hubs form the two ends of the rotational axis of the holder. Mounting the hubs at the outer side of the holder affords the advantage of providing the largest possible ratio of lens size accommodatable in the holder to the dimensions of the holder, that is, of the space requirement of the holder on the carrier.

Each hub preferably lies within a bearing support which is connected to the carrier (for example, the spherical cap). Both supports are closed about the hubs and the one of the two supports, which lies lower on the carrier, is provided with a closure piece at the lower end. The supports, which are closed about the hub, prevent possible exiting of the holder from the support because of the centrifugal forces or magnetic forces which act during the turnover operation. The closure piece at the lower end of the lower of the two supports functions as a support point of the end of the hub disposed therein in order to hold the holder in a defined position rotatable in the cutout of the carrier, that is, in a position wherein the turnover operation is not hindered by a contact between holder and carrier.

The hub being in the higher-lying support is preferably longer than the hub in the lower-lying support because, in this way, a deep seat of the two hubs in the supports is ensured with this deep seat being sufficient to prevent a dropping out of the holder. This can be an advantage but is not absolutely necessary for the functionality. The hub which is to be introduced in the higher-lying support is first introduced when placing the holder in order to thereafter guide the second hub in front of the opening of the deeper-lying support closed about the lower end. Supported by the force of gravity, the holder is thereafter guided up to the closure piece of the lower support. The hub lying in the higher-lying support moves out of the higher-lying support by the inner length of the lower-lying support. With this outward movement, the depth of the seat of the hub which is disposed in the higher-lying support is reduced.

It has been shown to be especially advantageous when the holder is built up asymmetrically in its support plane in the carrier perpendicular to its rotational axis in such a manner that, with reference to the rotational axis, one side is heavier than the other and the heavier side of the holder lies on the carrier while the other side does not touch the carrier. In this way, the center of gravity of the holder is disposed in the above-mentioned plane outside of the rotational axis on the heavier side of the holder. This position of the center of gravity in combination with the one-sided support on the carrier suppresses a raise or unwanted turning over during coating even when the carrier (for example, the spherical cap) is rotated at sufficiently moderate speed. On the other hand, this position of the center of gravity can be utilized for raising and subsequently turning over if the carrier (for example, the spherical cap) is rotated at sufficiently high speed and thereafter braked.

Preferably, the side, or a part thereof which lies against the carrier, forms the magnetizable part of the holder in order to be able to move this part during the turnover operation above the carrier in order, in turn, to utilize the above-described advantages of the magnetic field generator mounted above the carrier.

The above-given apparatus or the method described above is used in accordance with the invention preferably for turning over optical elements, for example, optical lenses.

BRIEF DESCRIPTION OF THE DRAWINGS

The invention will now be described with reference to the drawings wherein.

DESCRIPTION OF THE PREFERRED
EMBODIMENTS OF THE INVENTION

Figure 1:
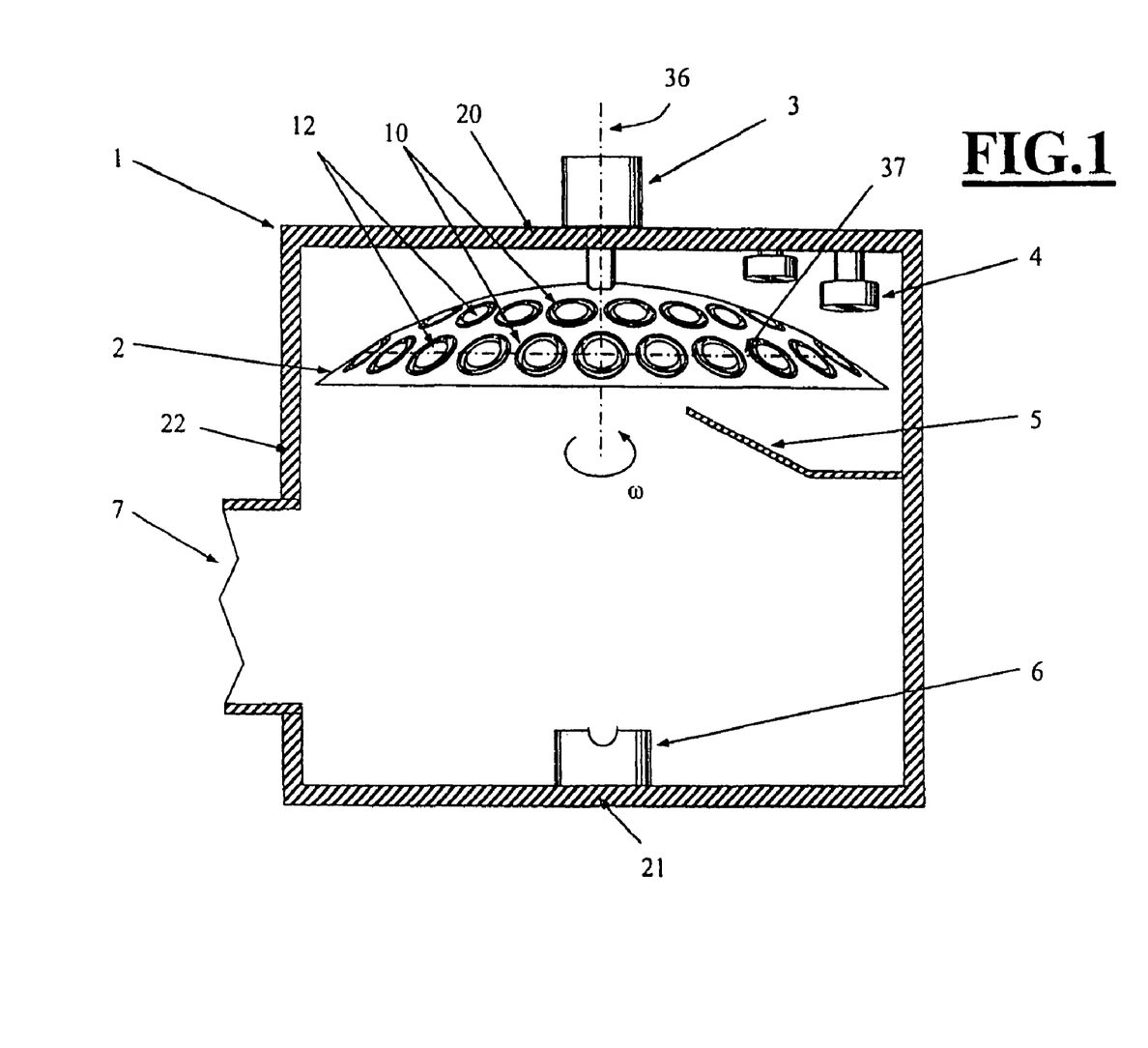
FIG. 1 is a schematic of a process chamber of a high vacuum vaporization system having an apparatus in accordance with the invention for turning over ophthalmic plastic lenses.

FIG. 1 shows schematically the configuration of a high vacuum vapor deposition system for spectacle lenses 12. A spherical cap 2 having lens holders 10 and lenses 12 is mounted on a drive module 3 on the ceiling plate 20 of the vacuum chamber 1 shown in cross section. The drive module 3 imparts a rotational movement (ω) to the spherical cap 2 about its symmetry axis (rotational axis 36). One or several magnetic coils 4 are mounted on the ceiling plate 20 above the spherical cap 2. The vaporization source 6 is disposed on the base 21 of the vacuum chamber 1 and, viewed from this vaporization source, the magnetic coils 4 are disposed behind a shield 5 in order to substantially avoid the deposition of vapor on the magnetic coils. The vaporization material (not shown) is heated to vaporization or sublimation in the vaporization source 6, for example, by means of an electric heater (not shown) or by means of an electron beam (not shown). An opening 7 is shown in a side wall 22 of the vacuum chamber 1 which leads to the vacuum pump system which is not shown.

Figure 2:
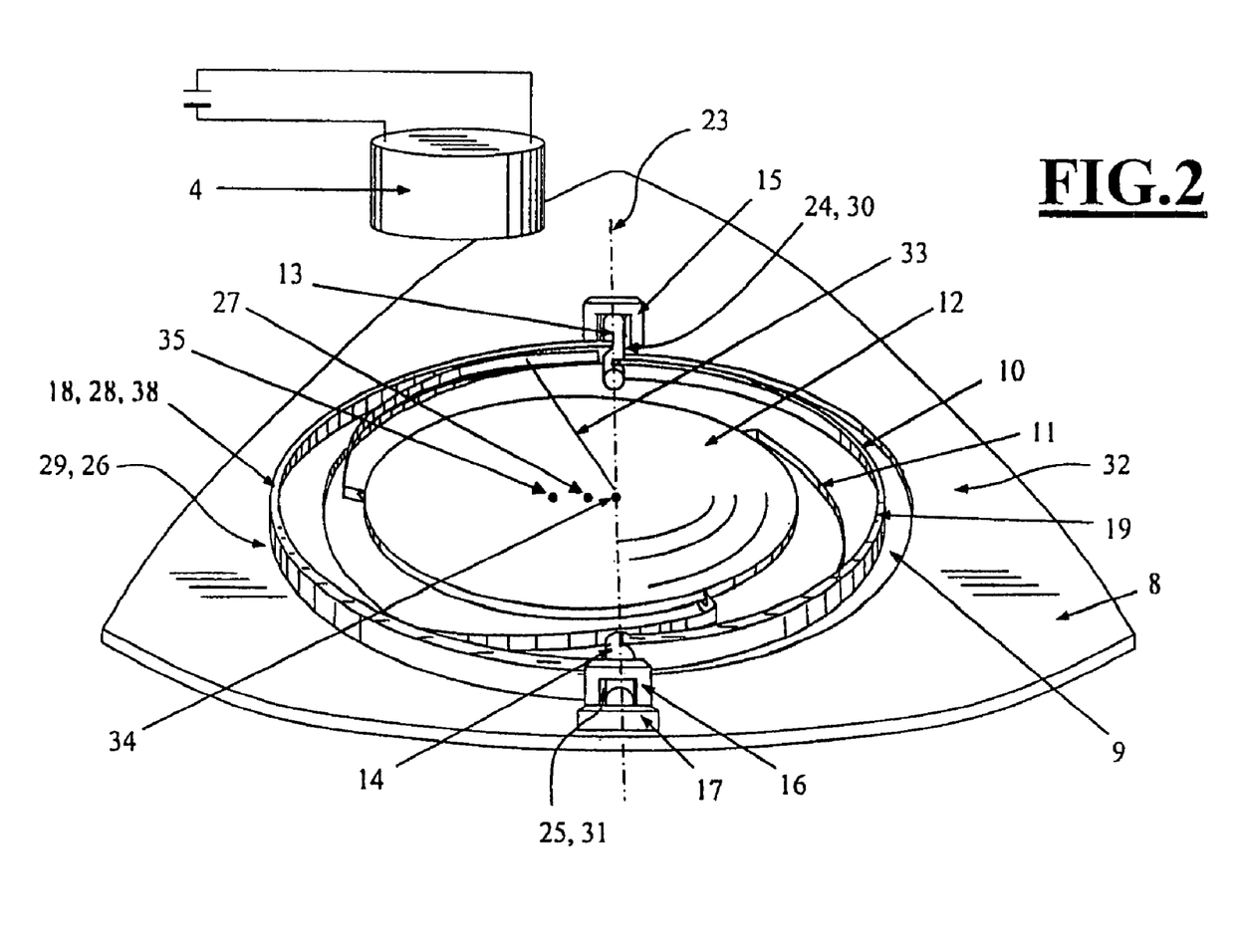
FIG. 2 is an enlarged perspective schematic showing the apparatus of the invention for turning over ophthalmic plastic lenses; and, FIG. 3 is a schematic, in plan, showing a plurality of holders seated in a linearly movable carrier in accordance with another embodiment of the invention.

In FIG. 2, a cutaway portion of the spherical cap 2 is shown. The carrier sheet metal 8 of the spherical cap 2 has circularly-shaped cutouts 9 for the lens holders 10. One cutout 9 is shown in the portion of the spherical cap 2 by way of example. In the cutout 9, a lens holder 10 is disposed and comprises a larger half-ring 18, a smaller half-ring 19, two hubs (13, 14) as well as tension springs 11 in which the lens 12 is clamped. The half-rings (18, 19) are each connected at their ends to the hubs (13, 14). The hubs (13, 14) lie opposite one another and form the two ends of the rotational axis 23 of the lens holder 10. When the lens holder 10 is in place, the hubs (13, 14) lie within respective ones of bearing supports (15, 16) and each support is connected to the carrier sheet metal 8. The support 16 lies lower on the carrier sheet metal 8 and is closed off at its lower end with a closure piece 17. With the closure piece 17 and the supports (15, 16), which are closed around the axes 23 of the hubs (13, 14), the lens holder 10 is held in the cutout 9 at two points (24, 25), especially during a rotation of the spherical cap 2. The larger half-ring 18 of the lens holder 10 simultaneously defines the ferromagnetic part 28 and shifts the center of gravity 27 of the lens holder 10 out of the rotational axis 23 because the mass of the half-ring 18 is greater relative to the smaller half-ring 19. In this way, the contact 29 of the larger half-ring 18 on the carrier sheet metal 8 forms the third point 26 of a stable three-point support in addition to the two support regions (30, 31) of the hubs (13, 14) in the supports (15, 16), that is, the larger half-ring 18 forms the third support 38 of the three-point support.

A magnetic coil 4 is mounted above the spherical cap 2. The distance between the magnetic coil 4 and the spherical cap 2 or a cutout 9 of the spherical cap 2 corresponds to slightly more than the radius 33 of the larger half-ring 18 of the lens holder 10 so that the turnover operation can take place directly below the magnetic coil 4. The cutout 9 is disposed directly below the magnetic coil 4. To turn over the lens holder 10 including the lens 12 contained therein, a sufficiently intense magnetic field is generated by means of the coil 4 and the field lines (not shown) go at least partially in the direction of the spherical cap 2. If the spherical cap 2 is rotated slowly in the direction in which the ferromagnetic part 28 of the lens holder 10 goes ahead of the rotational axis 23 of the lens holder 10, then the turnover of the lens holder 10 takes place when the lens holder 10 is moved with the spherical cap rotation beneath the switched-on coil 4. The lens holder 10 rotates on the rotational axis 23 in that it is aligned with the ferromagnetic part 28 toward the coil 4 in correspondence to the course of the magnetic field lines (not shown) and remains thus aligned until the ferromagnetic part 28 lies on the opposite-lying side of the cutout with reference to the start position.

The ferromagnetic part 28 can be completely demagnetized after the turnover operation, for example, by induction of a magnetic alternating field, which decays with increasing time, with the aid of the available coil 4.

In the separate case wherein the center of gravity 35 of the system "lens holder 10 with lens 12" lies higher than the center point 34 of the rotational axis 23 of the lens holder 10 and, with the rotation of the spherical cap 2, the rotational axis 23 moves ahead of the center of gravity 35 in the rotational direction, a turnover of the lens holder 10 can also be completed without the magnetic field or without a magnetic field generator 4 in that the rotation of the spherical cap 2 is so decelerated (that is, negatively accelerated) that the amount of the component of the vector of the negative acceleration becomes greater than the amount of the gravitational acceleration applied at the center of gravity 35. This component of the vector is applied at the center of gravity 35 and is opposite to the direction of the gravitational force. The resulting force leads via the lift-off of the third support 38 of the three-point support to a 180° rotation of the lens holder 10. For this variation of the turnover operation, the third support 38 of the three-point support need not be ferromagnetic.

The turnover operation can also be initiated in that the rotational speed of the spherical cap 2 is increased until the centrifugal force, which results at the center of gravity 35 of the system "lens holder 10 with lens 12", is sufficient for lifting the third support 18 of the three-point support. With increasing centrifugal force, the lens holder lifts up to the 90° angle with reference to the start position. With a subsequent braking of the rotation of the spherical cap, the rotation of the lens holder 10 continues until the third support 18 again lies on the side of the cutout 32 (as shown in FIG. 2) with this side lying opposite with reference to the start position.

Figure 3:
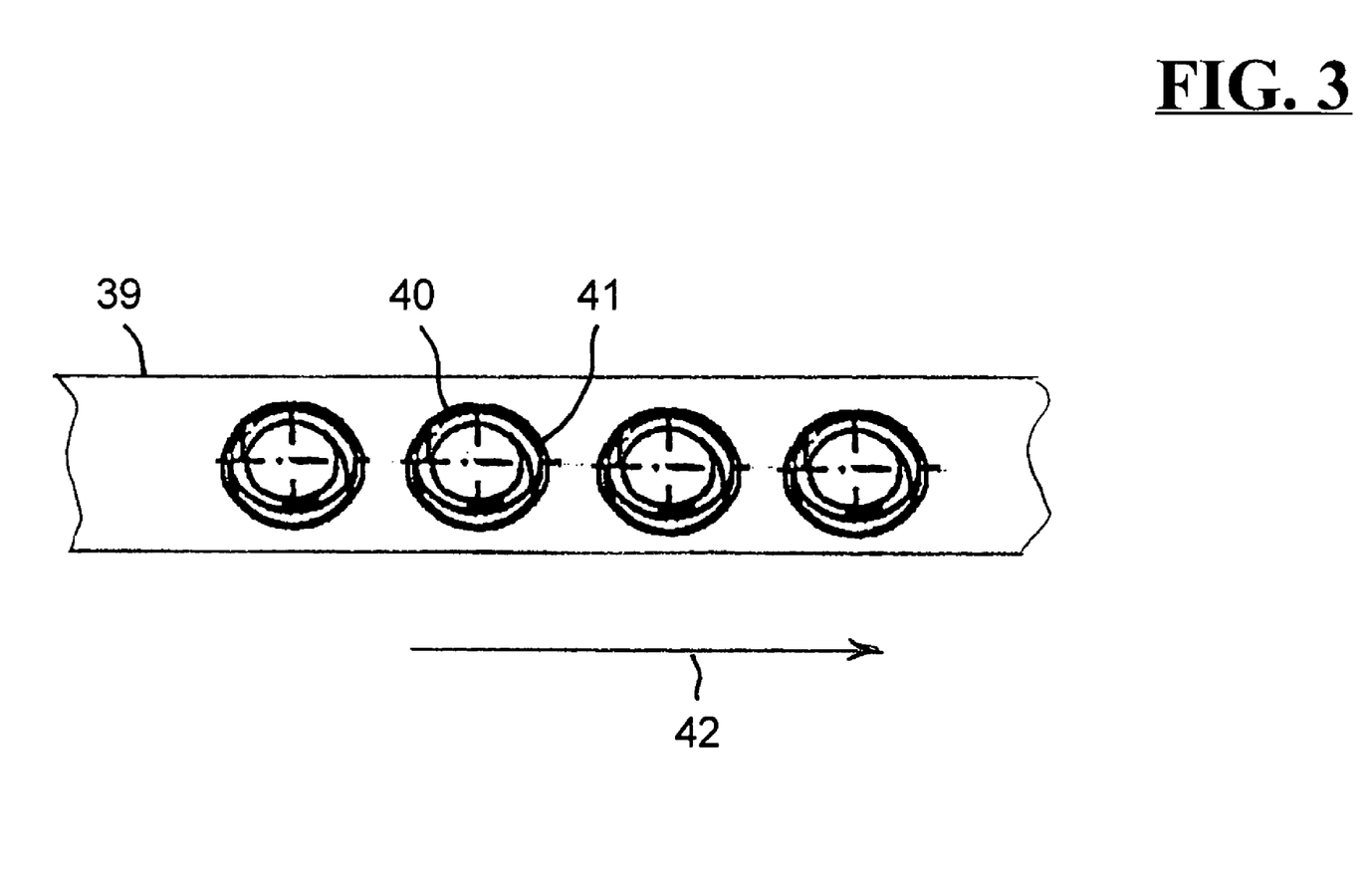

According to another embodiment, the carrier can be moved linearly as shown in FIG. 3. Here, the carrier 39 is elongated and the holders 40, which correspond to the holders in FIG. 2, are mounted in cutouts 41. The carrier moves through a vacuum coating chamber in a linear direction identified by arrow 42.

The invention has the above-mentioned advantages of known turnover apparatus and the effects of the disadvantages are, in contrast, reduced to a minimum or are absent entirely because no movable components are used to drive or to transfer force. The advantages compared to known turnover apparatus are obtained in accordance with the following points described in detail.

With the invention, the friction surfaces are reduced to a minimum. These surfaces lie in a region which is shaded with reference to the vaporization source 6 and are only slightly mechanically loaded so that with use in accordance with the invention, no contamination of the lenses 12 because of abraded particles results. The complexity of routine cleaning corresponds substantially to that for systems without turnover mechanisms. The total weight of the spherical cap 2 is only slightly greater than for systems without turnover mechanisms. The space, which is needed on the substrate carrier 2 additionally for the apparatus, is comparatively small so that the capacity is only minimally or not at all decreased.

It is understood that the foregoing description is that of the preferred embodiments of the invention and that various changes and modifications may be made thereto without departing from the spirit and scope of the invention as defined in the appended claims.

REFERENCE NUMERAL LIST

1 Vacuum chamber
2 Spherical cap
3 Drive module
4 Magnetic coil
5 Shield
6 Vaporization source
7 Opening
8 Carrier sheet metal
9 Cutout
10 Lens holder
11 Clamping spring
12 Ophthalmic plastic lens
13 Hub
14 Hub
15 Bearing support
16 Bearing support
17 Closure piece
18 Larger half-ring
19 Smaller half-ring
20 Ceiling plate
21 Base
22 Side wall
23 Rotational axis
24 First point
25 Second point
26 Third point
27 Gravity center of lens holder
28 Ferromagnetic part
29 Support
30 Support
31 Support
32 Cutout
33 Radius of the larger half-ring
34 Center of the rotational axis
35 Center of gravity of the system lens and lens holder
36 Rotational axis
37 Rotational line
38 Support
39 Carrier
40 Holders
41 Cutouts
42 Arrow

What is claimed is:

1. An apparatus for turning over an article in a vacuum coating system, the apparatus comprising:
    a carrier;
    a holder for holding said article;
    said holder being mounted on said carrier and being rotatable about a rotational axis;
    a turnover device for turning over said holder by rotation about said rotational axis;
    said turnover device including a force generator for generating a force needed to effect the turnover about said rotational axis;
    said force generator being operatively connected to said holder without a mechanical coupling therebetween so as to transfer said force thereto without movable components; and,
    wherein at least one of the following applies:
    (a) said carrier is movable to turn over said holder without said carrier itself being turned over; and,
    (b) said force generator being movable relative to said rotational axis for turning over said holder.

2. The apparatus of claim 1, wherein said force is an inertial force.

3. The apparatus of claim 2, wherein said carrier is configured to be linearly movable or rotatably movable and the linear movement or the rotational movement ($\omega$) of the carrier is accelerated or decelerated so as to cause said holder to turn over.

4. The apparatus of claim 3, wherein said rotational axis of said holder has a center point; and, said holder has a center of gravity which lies higher than said center point.

5. The apparatus of claim 3, wherein said rotational axis of said holder has a center point; said holder is seated in said carrier and passes along an imaginary line of rotation traced by the movement of said center point during the rotation (w) of said carrier; and, said rotational axis of said holder is oriented in an angular range of 0° to 90° referred to a tangent to said imaginary line of rotation.

6. The apparatus of claim 1, wherein said force is a magnetic force.

7. The apparatus of claim 6, wherein said carrier is configured to be linearly movable or rotatably movable; and, said holder interacts with said magnetic force to turn over said holder.

8. The apparatus of claim 7, wherein said force generator comprises at least one of a magnetic coil for generating said magnetic force and a permanent magnet for generating said magnetic force.

9. The apparatus of claim 8, wherein said at least one of said magnetic coil and said permanent magnet are mounted above said carrier.

10. The apparatus of claim 9, wherein said holder comprises a first half-ring having first and second ends and a second half-ring having first and second ends; said first ends of said half-rings are connected together as are said second ends thereof so as to cause said article to be annularly enclosed thereby; and, said first ring is larger than said second ring.

11. The apparatus of claim 10, wherein said magnetic coil and/or said permanent magnet has a lower exit end whereat magnetic field lines emanate therefrom; said magnetic coil and/or said permanent magnet encloses a first area at said lower exit end; said first and second half-rings conjointly enclose a second area; and, said first area is at least 0.2 times said second area.

12. The apparatus of claim 10, wherein said holder includes a magnetizable part.

13. The apparatus of claim 12, wherein said magnetizable part is a ferromagnetic part.

14. The apparatus of claim 12, wherein said magnetizable part is materially integral with said holder.

15. The apparatus of claim 12, wherein said magnetizable part is an individual part mounted on said holder.

16. The apparatus of claim 12, wherein said magnetizable part of said holder is the only part of said holder which is magnetizable.

17. The apparatus of claim 12, further comprising first and second mutually opposite-lying hubs on the outer side of said holder; said hubs defining the two ends of said rotational axis; first and second bearing supports connected to said carrier for accommodating respective ones of said first and second hubs therein; each of said bearing supports being closed about the hub corresponding thereto; said first and second bearing supports being mounted on said carrier with said first bearing support lying lower than said second bearing support; a closure piece for supporting said first bearing support; said hubs mounted in corresponding ones of said bearing supports defining first and second support points; said holder having a part configured to be a support acting as a third support point; said first, second and third support points conjointly defining a three-point support system; and, said third support point being defined by said magnetizable part.

18. The apparatus of claim 10, further comprising a magnetizable part mounted on said article.

19. The apparatus of claim 18, wherein said article is an ophthalmic plastic lens.

20. The apparatus of claim 1, further comprising first and second mutually opposite-lying hubs on the outer side of said holder; and, said hubs defining the two ends of said rotational axis.

21. The apparatus of claim 20, further comprising first and second bearing supports connected to said carrier for accommodating respective ones of said first and second hubs therein; each of said bearing supports being closed about the hub corresponding thereto; said first and second bearing supports being mounted on said carrier with said first bearing support lying lower than said second bearing support; and, a closure piece for supporting said first bearing support.

22. The apparatus of claim 21, wherein said second hub is longer than said first hub.

23. The apparatus of claim 21, wherein said hubs mounted in corresponding ones of said bearing supports define first and second support points; said holder has a part configured to be a support acting as a third support point; and, said first, second and third support points conjointly define a three-point support system.

24. A method for turning over an article in a vacuum coating system, the method comprising the steps of:
holding said article with a holder on a carrier with said holder being rotatable about a rotational axis;
providing a force generator for generating a force needed to effect a turning over of said holder about said rotational axis thereof with said force being transferred to said holder without a mechanical coupling between said force generator and said holder and without mechanically movable components;
turning over said holder holding said article about said rotational axis by applying said force; and,
carrying out at least one of the following additional steps:
(a) moving said carrier without said carrier itself being turned over; and,
(b) moving said force generator relative to said rotational axis of said holder for turning over said holder.

25. The method of claim 24, wherein said holder is so accelerated or decelerated that said holder turns over as a consequence of its inertia.

26. The method of claim 24, wherein said holder is turned over by magnetic interaction.

27. The method of claim 24, wherein said carrier is rotatably moved or linearly moved.

28. The method of claim 24, wherein said article is an optical element held by said holder and said holder is turned over with said optical element before, during and/or after the coating of said article in said vacuum coating system.

* * * * *

UNITED STATES PATENT AND TRADEMARK OFFICE
CERTIFICATE OF CORRECTION

| | |
|---|---|
| PATENT NO. | : 8,356,808 B2 |
| APPLICATION NO. | : 12/379809 |
| DATED | : January 22, 2013 |
| INVENTOR(S) | : Frank Macionczyk |

Page 1 of 1

It is certified that error appears in the above-identified patent and that said Letters Patent is hereby corrected as shown below:

In Title Page:
Please add -- (30) Foreign Application Priority Data
Sep. 1, 2006   (DE) ................... 10 2006 041 137.4 --.

In the Specification in Column 10:
Line 26: delete "(w)" and substitute -- (ω) -- therefor.

Signed and Sealed this
Ninth Day of April, 2013

Teresa Stanek Rea
*Acting Director of the United States Patent and Trademark Office*